United States Patent
Vanbesien

(10) Patent No.: US 6,354,874 B1
(45) Date of Patent: Mar. 12, 2002

(54) COMPONENT FOR MOUNTING ON A CIRCUIT BOARD

(76) Inventor: Johan Vanbesien, Meenseweg 464, B - 8902 Ieper (BE)

( * ) Notice: Subject to any disclaimer, the term of this patent is extended or adjusted under 35 U.S.C. 154(b) by 0 days.

(21) Appl. No.: 09/641,484

(22) Filed: Aug. 18, 2000

(30) Foreign Application Priority Data

Aug. 20, 1999 (DE) .......................... 199 39 582

(51) Int. Cl.[7] .............................. H01R 13/648
(52) U.S. Cl. ............................ 439/607; 439/80
(58) Field of Search .................. 439/79, 80, 607, 439/83

(56) References Cited

U.S. PATENT DOCUMENTS

| | | | | |
|---|---|---|---|---|
| 4,588,241 A | | 5/1986 | Ardezzone | 439/581 |
| 5,316,501 A | * | 5/1994 | Mair | 439/607 |
| 5,479,321 A | * | 12/1995 | Mair et al. | 361/816 |
| 5,928,035 A | * | 7/1999 | Jankowsky et al. | 439/607 |
| 6,050,854 A | * | 4/2000 | Fang et al. | 439/607 |
| 6,056,560 A | * | 5/2000 | Wu et al. | 439/108 |
| 6,086,429 A | * | 7/2000 | Wu | 439/676 |
| 6,109,933 A | * | 8/2000 | Lenoir et al. | 439/79 |
| 6,113,426 A | * | 9/2000 | Lin | 439/607 |
| 6,146,157 A | * | 11/2000 | Lenoir et al. | 430/101 |

FOREIGN PATENT DOCUMENTS

EP 0 604 213 A2 12/1993

\* cited by examiner

*Primary Examiner*—Tulsidas Patel
(74) *Attorney, Agent, or Firm*—Barley, Snyder, Senft & Cohen, LLC

(57) ABSTRACT

The component for mounting on a circuit board (LP) has a plurality of electrical terminal members (2) to be soldered to the circuit board (LP), and a shielding member (3) enclosing at least the electrical terminal members (2). The component described is characterized in that the shielding member (3) and the electrical terminal members (2) are movable relative to each other. The effect achievable thereby is that the shielding member (3) cannot impair mounting of the component concerned on the circuit board (LP).

13 Claims, 2 Drawing Sheets

COMPONENT FOR MOUNTING ON A CIRCUIT BOARD

FIELD OF THE INVENTION

The present invention relates to a device for mounting on a circuit board. In particular, the invention is directed to a device having a plurality of electrical terminal members to be soldered to the circuit board, and a shielding means enclosing at least the electrical terminal members.

BACKGROUND

Electrical components, such as electrical connectors, for mounting on a circuit board are well known in the industry. These types of connectors have contact elements provided therein for connecting the electrical connector with another electrical connector. A housing surrounds the electrical contact elements, and electrical terminal members extend out of the housing. The electrical terminal members are soldered to the electrical connector to a circuit board LP. Shielding means are generally provided and enclose the housing and the electrical terminal members.

In order to reduce degradation of signals transmitted across terminals, the use of shielding on electrical connectors has become more common. The shielding means usually consists of metal or metal-containing material, which encloses the component portions to be shielded to prevent or restrict electromagnetic radiation from radiating into the electrical connector. The shielding also prevents or restricts the emission of electromagnetic radiation from the connector.

In order to be able to simply and rapidly mount such shielded components on circuit boards, the shielding means arc integrally attached to the component, i.e. the shielding means is fixedly connected to the housing or other constituent parts of the particular component. However, it is important in many applications that the shielding means ends as exactly as possible with the circuit board surface when the component is mounted on the circuit board. If there is a gap between the circuit board and the shielding means, the shielding effect is deteriorated. If, in contrast thereto, the shielding means projects downwardly too much, the component can no longer be properly placed on the circuit board and/or proper soldering of the electrical terminal members to the circuit board is made difficult or rendered completely impossible. This is particularly true if the component concerned is a surface-mountable component (SMT component). In instances in which the shielding means, even in part, projects downwardly too far, the electrical terminal members of this component cannot be properly soldered to the circuit board, thereby preventing the component from consistently performing its function.

Manufacture, assembly, and/or handling of the components provided with shielding means thus require a high degree of precision. Understandably, this is a considerable disadvantage and can greatly increase the cost associated therewith. It is thus the object of the present invention to provide a component in which the shielding means will not impair the mounting of the component concerned on the circuit board and which will provide adequate shielding for the component.

SUMMARY OF THE INVENTION

An object of the invention is to provide an electrical connector in which the shielding means and the electrical terminal members are movable relative to each other. It is a further object of the invention to ensure, under all circumstances, that the shielding means is not in the way of proper mounting of the component on the circuit board while providing the optimum shielding effect under the circumstances given. A component designed in this manner can be mounted quickly, safely, and reliably on the circuit board, thereby ensuring the electrical connector will be properly shielded.

BRIEF DESCRIPTION OF DRAWING

The invention will be described hereinafter in more detail with reference to the drawings wherein.

DETAILED DESCRIPTION OF DRAWING

The component with respect to which the invention will be described in more detail hereinafter is an electrical connector designed to be mounted on a circuit board. However, the features of the electrical connector described in more detail hereinafter can be applied to other components that are designed for mounting on a circuit board and that are provided with a shielding means.

The electrical connector described in more detail herein comprises a multiplicity of electrical terminal members to be soldered to the circuit board. A shielding member is provided in the electrical connector which encloses at least the electrical terminal members.

The electrical terminal members are configured to be soldered to the circuit board. In the embodiment illustrated, in FIGS. 1 through 3, the terminal members arc SMT contacts designed for surface-mounting of the component on the circuit board. However, other types of electrical terminal members can be used without departing from the scope of the invention, i.e. terminal members designed for soldering (reflow soldering, wave soldering etc.) in plated through-holes of the circuit board. It is also contemplated that the electrical terminal members of the component, which are to be soldered to the circuit board, arc terminal members which are configured to be soldered to the opposite side of the circuit board.

It should be noted that the features described in more detail hereinafter are advantageous with components in which the electrical terminal members are SMT type contacts; however, positive effects are achieved with all components having terminal members which are to be soldered to the circuit board, irrespective of where and how such soldering takes place.

Figure 3:
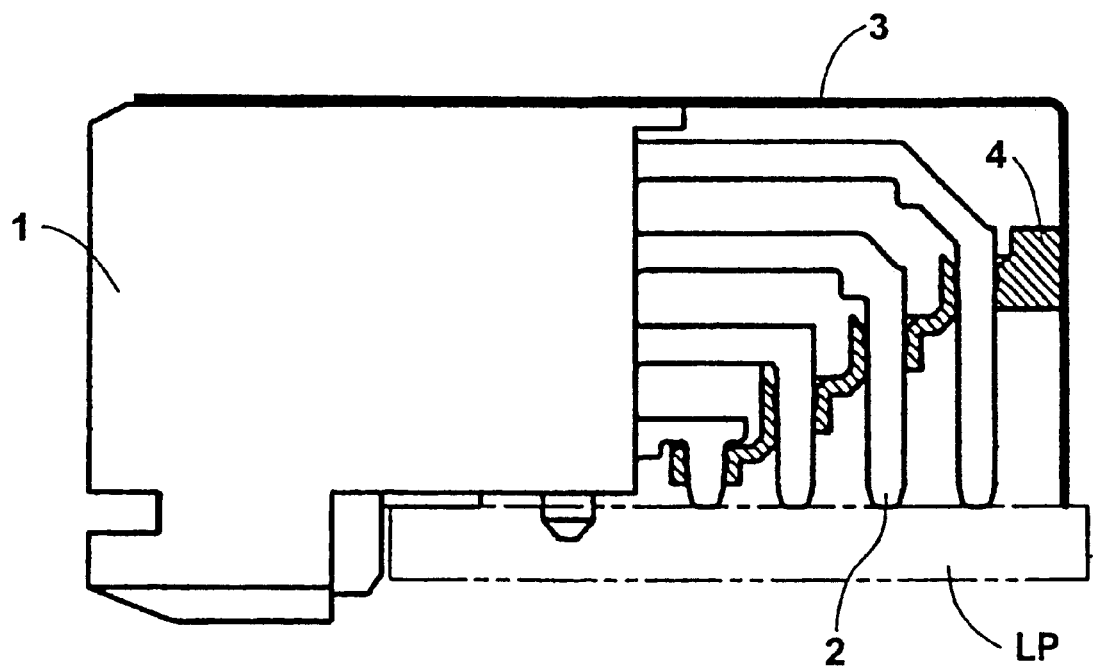
FIG. 3 shows an electrical connector having a shielding means, with the shielding means and the connector housing being rigidly connected to each other.

The electrical connector shown in FIG. 3 is a pluggable connector which may make electrical connection with a complementary connector inserted from the left-hand side in FIG. 3.

The connector shown in the figures is advantageous in that the shielding means and the electrical terminal members are movable relative to each other. This will be described in more detail hereinafter with reference to FIGS. 1 and 2.

The electrical terminal members 2 are passed through an alignment plate 4 and are held by the alignment plate in a predetermined position relative to each other. The alignment plate 4 is more fully described in DE 197 54 877 A1, which is hereby incorporated by reference.

The shielding member 3 in the embodiment illustrated enclosed the housing and is made of metal or metal-containing material. In particular, the shielding member encloses the component portions to be shielded (in the embodiment illustrated the housing 1 and the electrical terminal members 2). The shielding member extends across the top and sides of the housing and rests on the circuit board LP when the electrical connector is mounted on the circuit board (as shown in FIG. 3). The shielding member 3 is joined to the remaining parts of the electrical connector in such a manner that the electrical connector, inclusive of the shielding member, constitutes an integral or contiguous unit and is adapted to be mounted as such on the circuit board. Shielding member 3 is connected to the remaining parts of the electrical connector such that the shielding member 3 is movable relative to housing 1 and movable relative to electrical terminal members 2.

In the embodiment illustrated, shielding member 3 is connected at two locations to the electrical connector, at housing 1 and at alignment plate 4. The shielding member 3 is attached to housing 1 by resilient tongues 11. The shielding means is held between the housing 1 and two elastically resilient tongues 11 provided at the top of housing 1. In the embodiment illustrated, in FIGS. 1 and 2, tongues 11 have their left-hand ends connected to housing 1 and from there extend to the right in parallel manner. Shielding member 3 is adapted to be slidingly inserted (from the right-hand side of FIGS. 1 and 2) between the top side of housing 1 and the tongues 11. When fully inserted on the housing 1, the shielding member 3 is clamped between the top side of housing 1 and tongues 11.

The connection of shielding member 3 and alignment plate 4 is a connection which allows the shielding member to be more relative to the alignment plate. The connection between shielding member 3 and alignment plate 4 is accomplished by the cooperation of an opening formed in a side wall of shielding member 3 (in the embodiment illustrated, the opening is in the rear side wall thereof) and a pin 41 provided on the alignment plate 4. The opening (not shown in the drawing) in the shielding member 3 and the pin 41 are dimensioned such that the opening, and consequently shielding member, are capable of moving transversely of pin 41. The opening in the shielding member preferably is an elongate hole extending in vertical direction, thereby allowing the shielding member to be pivoted up and down in a limited manner. This action is illustrated in FIGS. 1 and 2.

Figure 2:
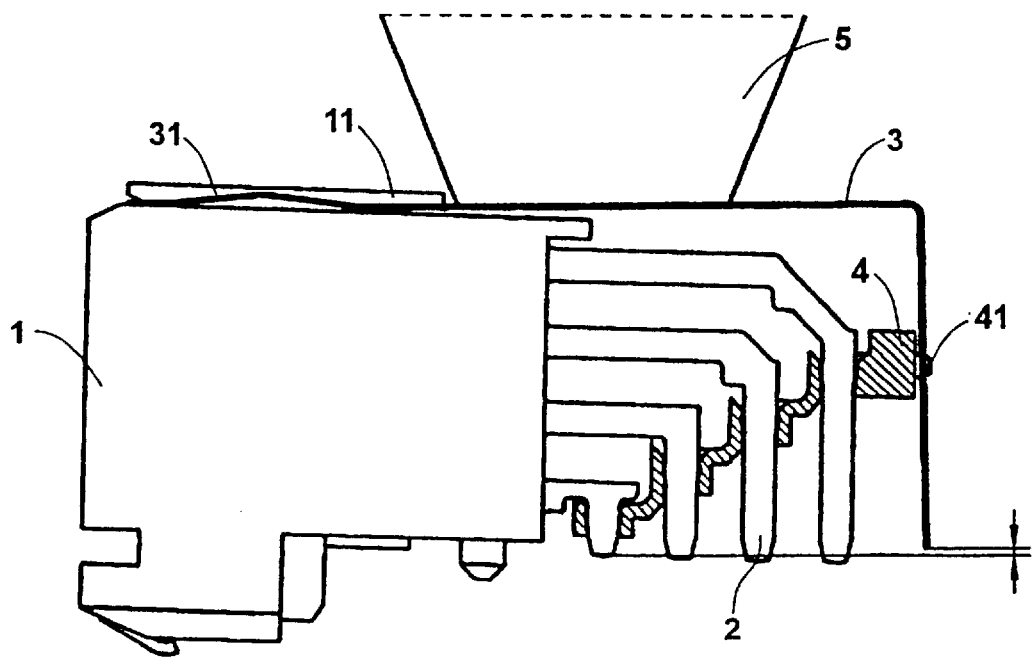
FIG. 2 shows the electrical connector illustrated in FIG. 1 in a first position, in which the top of the housing and the top of the shielding member are not in alignment.

As show in FIG. 2, a vacuum pipette 5 engages shield member 3. Such vacuum pipettes are generally used in loading circuit boards with the components to be provided thereon. The vacuum pipette takes up the components to be mounted on the circuit board, as shown in FIG. 2, and places the same in the associated position on the circuit board.

Figure 1:
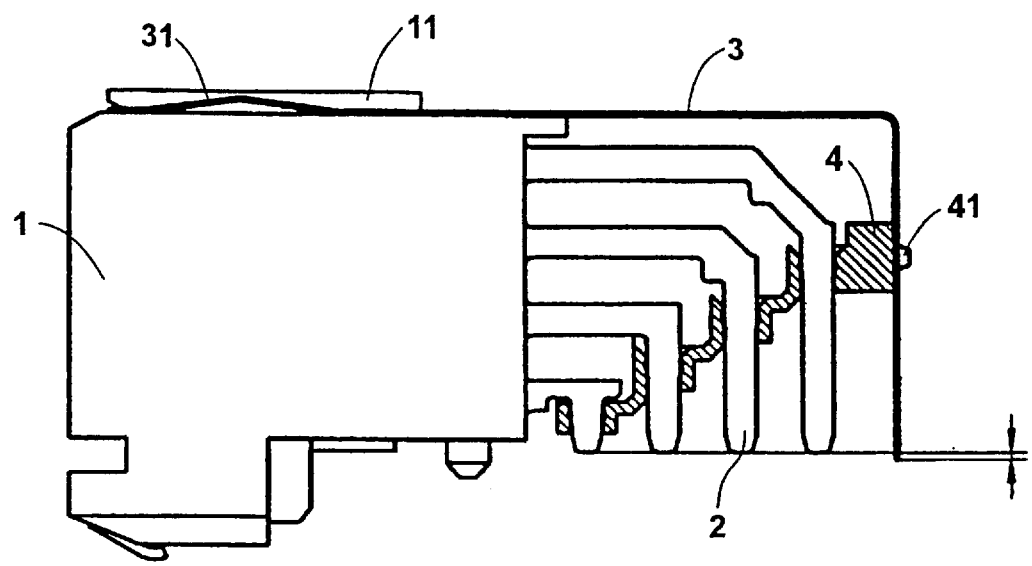
FIG. 1 shows an electrical connector having a shielding member in a first position, in which the top of the housing and the top of the shielding member are essentially in alignment.

Referring to FIG. 1, the lower end of the side of the shielding member 3 facing away from housing 1 is disposed at a lower level than the free ends of the electrical terminal members 2 (the parts thereof to be soldered to the circuit board). In contrast in the electrical connector shown in FIG. 2, the lower end of the side of the shielding member 3 facing away from housing 1 is disposed at a higher level than the free ends of the electrical terminal members 2 (the parts thereof to be soldered to the circuit board).

As the vacuum pipette 5 engages the electrical connector on shielding means 3, the shielding member will pivot relative to the housing and the free ends of the terminals will be positioned below the lower end of the shielding member 3. The pipette 5 moves the connector and places the same to abut on the circuit board. As the ends of the terminals are below the lower end of the shield member, the free ends of the terminals will engage the circuit board first, thereby ensuring that the terminals and circuit board will be properly aligned. As the shielding member has been pivoted or rotated, the shielding member will not cause misalignment of the terminals. When the vacuum pipette 5 releases the component, or more strictly speaking the shielding member 3 thereof, the shielding member is pivoted or lowered onto the circuit board from the position shown in FIG. 2 to the position shown in FIG. 3. Shielding member 3 then abuts on the circuit board substantially without a gap therebetween and thus provides the optimum shielding effect.

The design and arrangement of shielding member 3 as described is advantageous for several reasons. First, the component can be properly mounted on the circuit board rapidly, simply, and safely, as the shielding member does not interfere with the installation. Second, the shielding member provides an optimum shielding effect, as the shield rotates into engagement the circuit board.

The tongues 11 effecting the connection between housing 1 and shielding member 3 perform a double function in the embodiment illustrated. The tongues not only clamp or hold the shielding member to the housing 1, the tongues 11 also function as coding elements. The coding prevents improper mating of the electrical connector to another electrical connector which is not compatible therewith or which is improperly oriented.

The shielding member 3 also has bulges 31 provided on the housing topside, preferably between the tongues 11. The bulges 31 are contact elements which can make electrical contact with similar contact elements of a complementary connector when the connectors are mated together.

It should be noted that the electrical connector described can be modified in a variety of ways. The invention of course is not restricted to the provision of two tongues 11. There may also be provided an arbitrary different number of tongues 11. Moreover, the invention is not restricted to the tongues being connected to the housing at one specific location or extending in one specific direction.

The connection between shielding member 3 and housing 1 can be effected in a different manner than with the use of tongues. The fact that equivalent alternatives exist for the described connection between the shielding member 3 and housing 1, should be evident and does not require further explanation. Furthermore, the invention is not restricted to the fact that each of the shielding member 3 and the tongues 11 perform more than one function.

It is also possible and within the scope of the invention to connect the shielding member 3 to the circuit board LP. In case of surface-mounted components like the electrical connector in the embodiment illustrated, this connection preferably between the shielding member and the circuit board is established by using an SMT technique. However, this connection can be made in any manner desired. Soldering of the electrical terminal members 2 to the circuit board and soldering of the shielding member 3 to the circuit board can be carried out (in accordance with the particular circumstances) either simultaneously or successively. Soldering or other connection of the shielding member 3 to the circuit board can be advantageous in two respects: first, a potential (for example ground potential) favorable for shielding can be applied to the shielding member via the connection to the circuit board, and second, the shielding member is fixedly secured to the circuit board. In fact, as the mounting of the electrical connector to the circuit board is complete when the shielding member and circuit board are moved into engagement, the movement of the shielding member after mating is not beneficial. Consequently, the shielding member may be connected to the circuit board. However, this is not absolutely necessary.

With components designed as described, it is possible, irrespective of the details of the practical realization thereof, to ensure in very simple manner that the shielding member will not impair mounting of the particular components on the circuit board.

The above description relates to having a shielding member which is mounted to housing in a manner to allow the shielding member to be movable relative to the housing and the electrical terminals. The foregoing description illustrates just some of the possibilities for practicing the invention. Many other embodiments are possible within the scope of the invention. It is, therefore, intended that the foregoing description be regarded as illustrative rather than limiting, and that the scope of the invention is given by the appended claims together with their full range of equivalents.

What is claimed is:

1. A component for mounting on a circuit board, comprising a plurality of electrical terminal members to be soldered to the circuit board, a shielding member enclosing at least the electrical terminal members, the shielding member and the electrical terminal members are movable relative to each other, a housing having a resilient tongue provided thereon, the shielding member is slidingly inserted and held between the housing and the resilient tongue, thereby allowing the shielding member to pivot relative to the housing.

2. The component of claim 1 wherein the shielding member is a separate member which, independent of soldering of the electrical terminal members, is adapted to be soldered to the electrical connector.

3. The component of claim 1 wherein the shielding member is a body consisting of metal or metal-containing material which encloses the component portions to be shielded, laterally and at the top.

4. The component of claim 2 wherein the shielding member, a housing, and the electrical terminal members constitute an integral unit or are adapted to be joined together so as to form an integral unit.

5. The component of claim 3 wherein the shielding member is adapted to be clampingly connected to the housing of the component.

6. The component of claim 1 wherein the shielding member has an opening in one of its side walls, said opening, being placed over a pin provided on the component.

7. The component of claim 6 wherein the opening of the shielding member is an elongate hole extending in a vertical direction.

8. The component of claim 3 wherein the movability of the shielding member relative to the electrical terminal members is confined to directions along which the shielding member has to be movable away from the electrical terminal members during mounting of the component on the circuit board so as to not hinder mounting of the component.

9. The component of claim 1 wherein the relative movability of shielding member and electrical terminal members is confined to the distance in which the shielding member has to be movable away from the electrical terminal members during mounting of the component on the circuit board so as to not hinder mounting of the component.

10. The component of claim 1 wherein the shielding member is movably connected to the housing of the component such that the locations of free ends of the electrical terminal members to be soldered to the circuit board, in the state of the component held on the shielding member, are disposed at a lower level than the part of the shielding member resting on the circuit board when the component is in its state mounted on the circuit board.

11. The component of claim 1 wherein the shielding member is movably connected to the housing of the component such that the locations of free ends of the electrical terminal members to be soldered to the circuit board, in the state of the component held on a part other than the shielding member, are disposed at a higher level than the part of the shielding member resting on the circuit board when the component is in its state mounted on the circuit board.

12. The component of claim 1 wherein the shielding member is connected to the circuit board.

13. The component of claim 1 wherein the shielding member has bulges provided on the housing, the bulges are contact elements which make electrical connection with mating contact elements of a mating connector when the component and the mating electrical connector are mated together.

* * * * *